US011869561B2

(12) United States Patent
Frougier et al.

(10) Patent No.: US 11,869,561 B2
(45) Date of Patent: Jan. 9, 2024

(54) SPIN ORBIT-TORQUE MAGNETIC RANDOM-ACCESS MEMORY (SOT-MRAM) WITH CROSS-POINT SPIN HALL EFFECT (SHE) WRITE LINES AND REMOTE SENSING READ MAGNETIC TUNNEL-JUNCTION (MTJ)

(71) Applicant: International Business Machines Corporation, Armonk, NY (US)

(72) Inventors: Julien Frougier, Albany, NY (US); Dimitri Houssameddine, Sunnyvale, CA (US); Ruilong Xie, Niskayuna, NY (US); Kangguo Cheng, Schenectady, NY (US); Michael Rizzolo, Delmar, NY (US)

(73) Assignee: International Business Machines Corporation, Armonk, NY (US)

( * ) Notice: Subject to any disclaimer, the term of this patent is extended or adjusted under 35 U.S.C. 154(b) by 280 days.

(21) Appl. No.: 17/483,755

(22) Filed: Sep. 23, 2021

(65) Prior Publication Data
US 2023/0086181 A1 Mar. 23, 2023

(51) Int. Cl.
*G11C 11/16* (2006.01)
*G11C 11/18* (2006.01)
(Continued)

(52) U.S. Cl.
CPC ........ *G11C 11/161* (2013.01); *G11C 11/1673* (2013.01); *G11C 11/1675* (2013.01);
(Continued)

(58) Field of Classification Search
CPC .................................................. G11C 11/161
See application file for complete search history.

(56) References Cited

U.S. PATENT DOCUMENTS

| 7,982,646 B2 | 7/2011 | Herr |
| 8,786,476 B2 | 7/2014 | Bunyk |

(Continued)

FOREIGN PATENT DOCUMENTS

| WO | 20170525421 W | 3/2017 |
| WO | 2017139683 | 8/2017 |

OTHER PUBLICATIONS

Yi Cao et al., "Prospect of Spin-Orbitronic Devices and Their Applications", iScience 23, 101614, Oct. 23, 2020, pp. 1-22.

(Continued)

*Primary Examiner* — Jason Lappas
(74) *Attorney, Agent, or Firm* — Daniel Morris; Otterstedt & Kammer PLLC

(57) ABSTRACT

A cross-point SOT-MRAM cell includes: a first SHE write line; a second SHE write line non-colinear to the first SHE write line; a cross-point free layer comprising a first free layer, a second free layer, and a dielectric layer disposed between the first and the second free layers, the cross-point free layer configured to store a magnetic bit and located between and in contact with both the first SHE write line and the second SHE write line; and a remote sensing MTJ located in a vicinity of the cross-point free layer, wherein a free layer sensor of the remote sensing MTJ is in contact with one of the first SHE write line and the second SHE write line.

20 Claims, 14 Drawing Sheets

(51) Int. Cl.
- *H01F 10/32* (2006.01)
- *H10B 61/00* (2023.01)
- *H10N 50/10* (2023.01)
- *H10N 50/85* (2023.01)
- *H10N 52/01* (2023.01)
- *H10N 52/80* (2023.01)

(52) U.S. Cl.
CPC .......... *G11C 11/18* (2013.01); *H01F 10/3272* (2013.01); *H10B 61/00* (2023.02); *H10N 50/10* (2023.02); *H10N 50/85* (2023.02); *H10N 52/01* (2023.02); *H10N 52/80* (2023.02)

(56) References Cited

U.S. PATENT DOCUMENTS

| | | | |
|---|---|---|---|
| 9,218,864 | B1 | 12/2015 | Yi |
| 9,460,768 | B2 | 10/2016 | Manipatruni |
| 9,589,618 | B2 | 3/2017 | Liu |
| 9,620,188 | B2 | 4/2017 | Manipatruni |
| 9,646,670 | B2 | 5/2017 | Lee |
| 9,691,458 | B2 | 6/2017 | Ralph |
| 9,830,966 | B2 | 11/2017 | Mihajlovic |
| 9,979,400 | B1 | 5/2018 | Sete |
| 10,134,457 | B1 | 11/2018 | Mihajlovic |
| 10,381,060 | B2 | 8/2019 | Kan |
| 10,381,552 | B2 | 8/2019 | Mihajlovic |
| 10,411,804 | B2 | 9/2019 | Ashrafi |
| 10,490,601 | B2 | 11/2019 | Braganca |
| 10,643,143 | B2 | 5/2020 | Bloom |
| 10,891,999 | B1 | 1/2021 | Mihajlovic |
| 2017/0148978 | A1* | 5/2017 | Apalkov ............... G11C 11/161 |

OTHER PUBLICATIONS

Runze Lin et al., "Fabrication and characteristics of flexible normally-off AlGaN/GaN HEMTs", AIP Advances 10, 105013 (Oct. 2020), pp. 1-7.

* cited by examiner

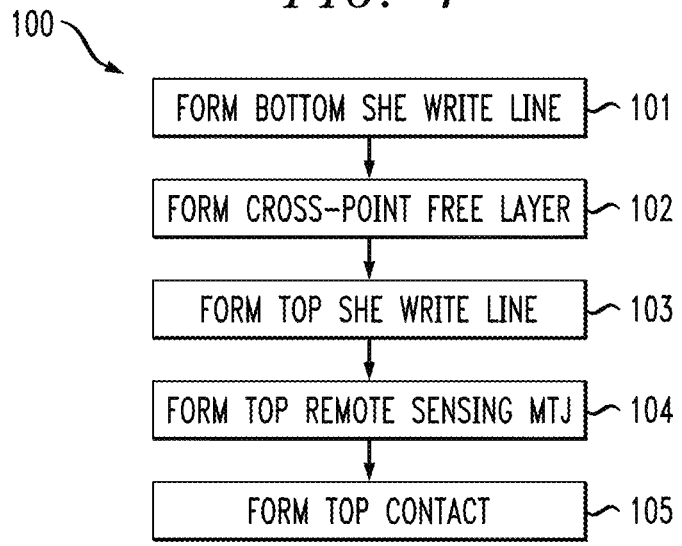
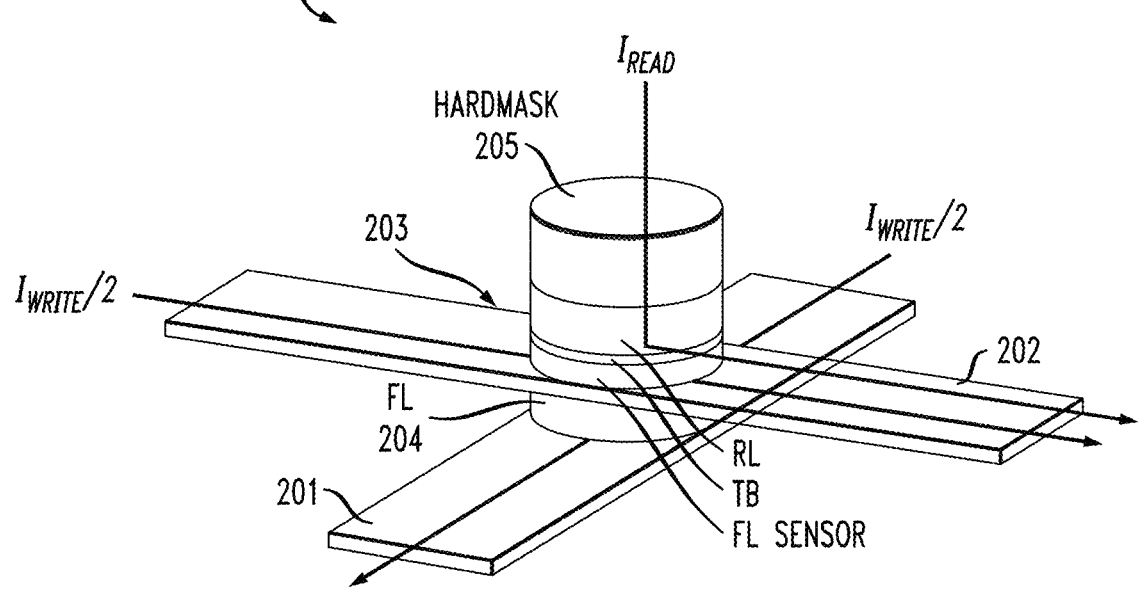

SPIN ORBIT-TORQUE MAGNETIC RANDOM-ACCESS MEMORY (SOT-MRAM) WITH CROSS-POINT SPIN HALL EFFECT (SHE) WRITE LINES AND REMOTE SENSING READ MAGNETIC TUNNEL-JUNCTION (MTJ)

BACKGROUND

Magnetic Random-Access Memory (MRAM) is an important memory technology. Spin Transfer Torque (STT) MRAM is an example MRAM implementation. STT-MRAM is a two terminal device with the same write/read path, which can impair the read reliability. The write current can also impose stress on a Magnetic Tunnel-Junction (MTJ), leading to time dependent degradation of the memory cell.

The conventional STT-MRAM is a 2-terminal device. An optimal configuration of the STT-MRAM device includes one MRAM cell, one driver transistor, one word line, and one bit line. The STT-MRAM device may be integrated on top of a driver transistor. The STT-MRAM device may achieve bit-cell scaling.

By contrast, SOT (Spin Orbit-Torque) MRAM is an emerging configuration of an MRAM cell, which separates the read and write paths of the memory, improving device endurance and read stability. The conventional SOT-MRAM device is a 3-Terminal Device. By design, the footprint of the conventional SOT-MRAM device is significantly larger than the STT-MRAM. The requirements for one conventional SOT-MRAM device include one MRAM cell, two driver transistors, one word line, one bit line, and one write line. Thus, the conventional SOT-MRAM introduces an integration density problem.

BRIEF SUMMARY

According to embodiments of the present invention, a cross-point SOT-MRAM cell includes: a first SHE write line; a second SHE write line non-colinear to the first SHE write line; a cross-point free layer comprising a first free layer, a second free layer, and a dielectric layer disposed between the first and the second free layers, the cross-point free layer configured to store a magnetic bit and located between and in contact with both the first SHE write line and the second SHE write line; and a remote sensing MTJ located in a vicinity of the cross-point free layer, wherein a free layer sensor of the remote sensing MTJ is in contact with one of the first SHE write line and the second SHE write line.

According to an embodiment of the present invention, a method of forming cross-point SOT-MRAMs comprises: forming a bottom SHE write line; forming a cross-point free layer on the bottom SHE write line, wherein forming the cross-point free layer comprises forming a first free layer, a second free layer, and a dielectric layer disposed between the first and the second free layers; forming a top SHE write line on the cross-point free layer, wherein the top SHE write line is non-colinear to the bottom SHE write line; and forming a top remote sensing MTJ on the top SHE write line.

According to an embodiment of the present invention, a method of forming a cross-point spin orbit-torque magnetic random-access memory cell comprising: forming a bottom remote sensing magnetic tunnel junction on a substrate; forming a bottom spin-hall effect write line on the bottom remote sensing magnetic tunnel-junction; forming a cross-point free layer on the bottom spin-hall effect write line, wherein forming the cross-point free layer comprises forming a first free layer, a second free layer, and a dielectric layer disposed between the first and the second free layers; forming a top spin-hall effect write line on the cross-point free layer, wherein the top spin-hall effect write line is non-colinear to the bottom spin-hall effect write line.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware mod-ule(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects. Some embodiments may not have these potential advantages and these potential advantages are not necessarily required of all embodiments. For example, one or more embodiments may provide for:

structure that enables SOT-MRAM integration and operation in a true cross-point architecture;

structure that improves density for SOT-MRAM technologies;

structure that enables independent Write (cross-point) and Read operations; and a device having a true SOT write operation, with no requirement for STT-assisted writing.

These and other features and advantages of the present invention will become apparent from the following detailed description of illustrative embodiments thereof, which is to be read in connection with the accompanying drawings.

BRIEF DESCRIPTION OF THE DRAWINGS

Preferred embodiments of the present invention will be described below in more detail, with reference to the accompanying drawings:

FIG. 1 is method of manufacturing a SOT-MRAM with cross-point SHE write lines and remote sensing read MTJ according to one or more embodiments of the present invention;

FIG. 2 is a diagram of a SOT-MRAM with cross-point SHE write lines and remote sensing read MTJ according to one or more embodiments of the present invention;

DETAILED DESCRIPTION

Figure 3:
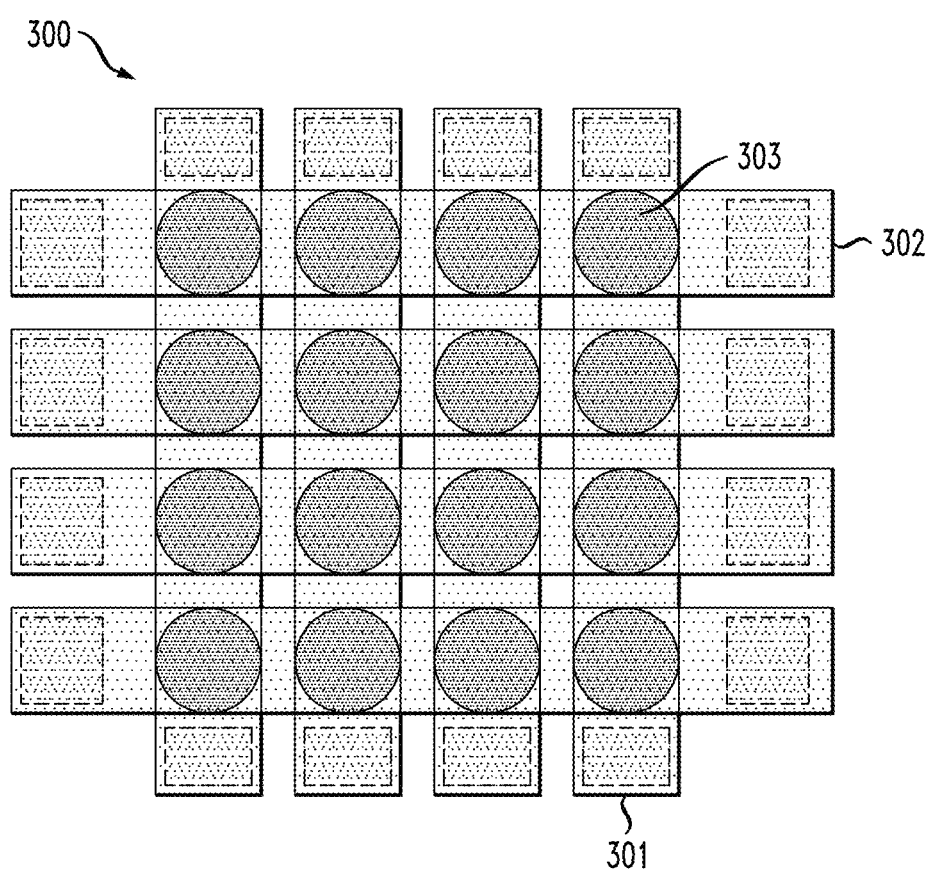
FIG. 3 is a plan view of a SOT-MRAM device according to one or more embodiments of the present invention.

According to embodiments of the present invention, a cross-point Spin-Orbit Torque (SOT) Magnetic Random-Access Memory (MRAM) enables improved integration density. Embodiments of the present invention confine a current in a given/selected line. Embodiments of the present invention isolate a device for a given write or read operation. Embodiments of the present invention enable improved selection of memory cells for write and read operations in cross-point SOT-MRAM.

According to one or more embodiments of the present invention, a method 100 of forming cross-point SOT-MRAMs (see FIG. 1) includes: forming a bottom Spin Hall Effect (SHE) write line at step 101; forming a cross-point free layer (FL) at step 102; forming a top SHE write line at step 103; forming a top remote sensing Magnetic Tunnel-Junction (MTJ) at step 104; and forming a top contact at step 105.

FIG. 2 is a diagram of an SOT-MRAM device 200 with cross-point SHE write lines and remote sensing read MTJ according to one or more embodiments of the present invention. The SOT-MRAM device 200 includes cross-point write lines 201, 202, a remote sensing read MTJ 203, a cross-point FL 204, and a top contact 205. The remote sensing read MTJ 203 includes a reference layer (RL), a tunneling barrier (TB), and an FL sensor.

FIG. 2 further illustrates, according to some embodiments, a read signal, $I_{Read}$, for reading data (e.g., bit data corresponding to a magnetization of the FL sensor) stored by the MTJ 203 of the SOT-MRAM device 200, and write signals $I_{Write}/2$ for writing data (e.g., a bit) to the FL 204 of the SOT-MRAM device 200.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., Silicon VLSI Technology: Fundamentals, Practice, and Modeling 1st Edition, Prentice Hall, 2001 and P. H. Holloway et al., Handbook of Compound Semiconductors: Growth, Processing, Characterization, and Devices, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

FIG. 3 is a plan view of a SOT-MRAM device 300 according to one or more embodiments of the present invention. The SOT-MRAM device 300 has a true cross-point configuration, demonstrates a true SOT write operation, and requires no STT-assisted writing for the cross-point FL. According to some embodiments, the SOT-MRAM device 300 includes cross-point write lines 301, 302, and a remote sensing read MTJ 303. The cross-point write lines 301 and 302 are SOT lines with SHE properties. According to some embodiments, bit selection is done by cross-point architecture.

Figure 4:
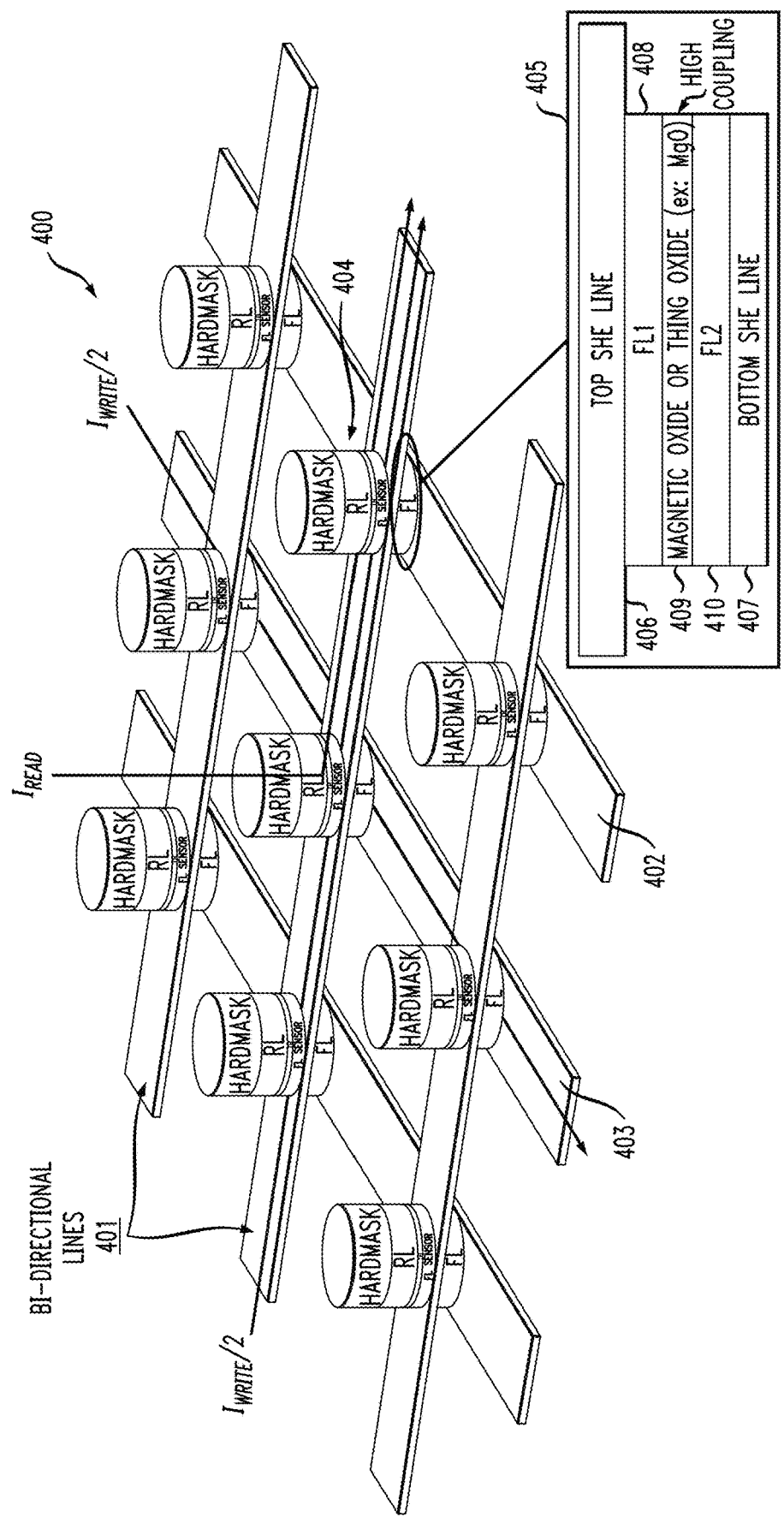
FIG. 4 is a diagram of a SOT-MRAM 2D array according to one or more embodiments of the present invention.

FIG. 4 is a diagram of an SOT-MRAM 2D array 400 according to one or more embodiments of the present invention. The SOT-MRAM 2D array 400 includes a first set of bi-directional lines, e.g., 401, and a second set of bi-directional lines, e.g., 402. According to some embodiments, lines within the first set of bi-directional lines, e.g., 401, are isolated from each other and lines within the second set of bi-directional lines, e.g., 402, 403, etc. are isolated from each other. Further, according to example embodiments, lines between the different set of lines (e.g., between the first and second sets of bi-directional lines) are isolated from each other, such that there is no shorting through the cross-point free layer. Each SOT-MRAM cell, e.g., 404, includes a cross-point FL shown in detail view 405. As shown in detail view 405, the cross-point FL is disposed between the top SHE line 406 and the bottom SHE line 407. According to some embodiments, the cross-point FL comprises an upper cross-point FL 408, a dielectric layer 409, formed of a magnetic oxide or thin oxide (e.g., MgO), and a lower cross-point FL 410. According to at least one embodiment, the cross-point free layer includes the dielectric layer 409 between FL1 408 and FL2 410, which prevents shorting through the cross-point free layer.

According to an example embodiment, the dielectric layer 409 in the cross-point FL isolates the top SHE line 406 from the bottom SHE line 407 in the cross-point region and provides a high magnetic coupling between FL1 408 and FL2 410 so that FL1 and FL2 can only switch as a single FL unit. According to some embodiments of the present invention, the FL cannot reverse its magnetization unless both the top SHE line and the bottom SHE line are simultaneously active to flip the FL1 and FL2 magnetization.

FIG. 4 further illustrates a read signal, $I_{Read}$, and write signals $I_{Write}/2$. The read signal, $I_{Read}$, is further illustrated in FIG. 5, FIG. 7, and FIG. 8.

Figure 5:
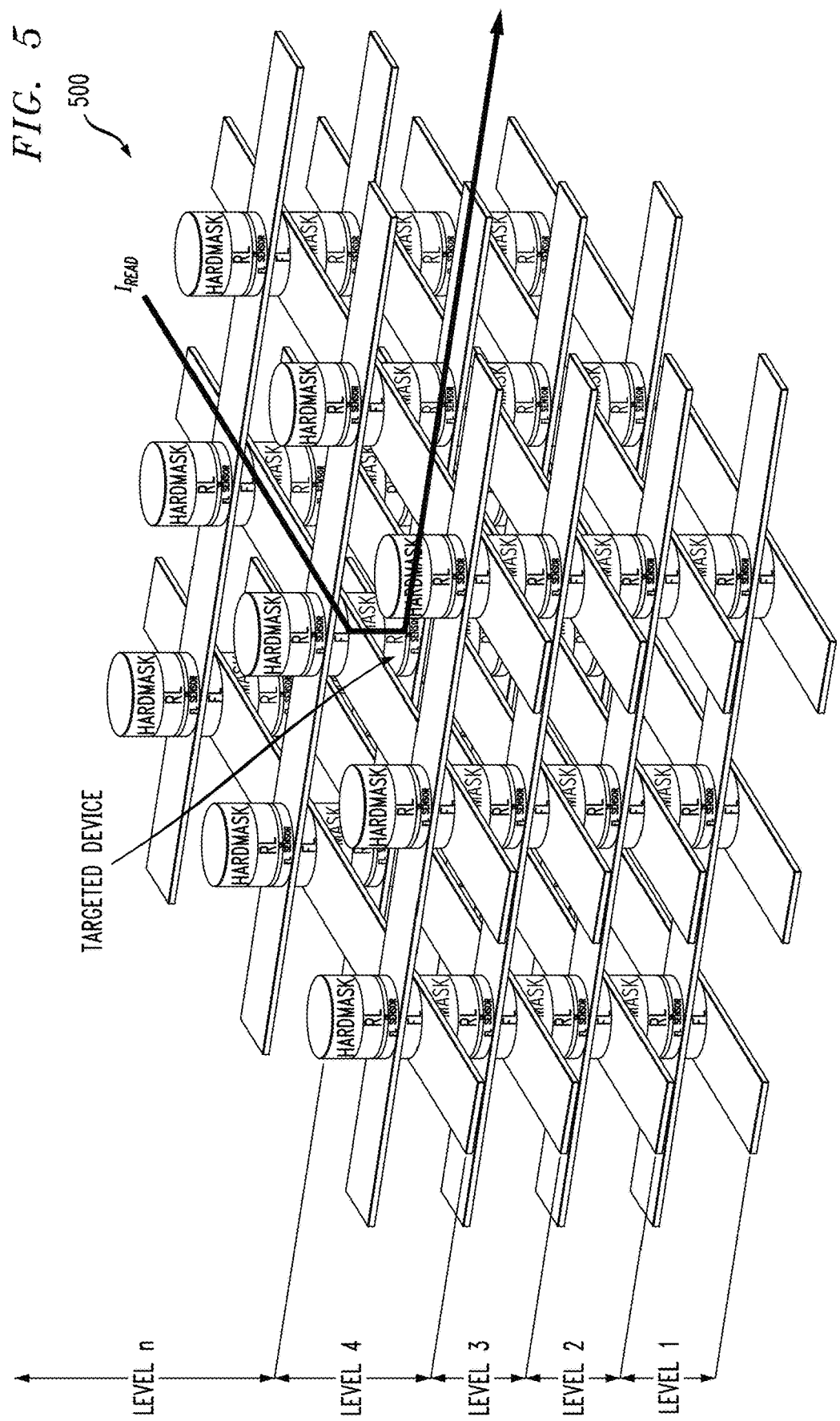
FIG. 5 is a diagram of a SOT-MRAM 3D array according to one or more embodiments of the present invention.

FIG. 5 is a diagram of an SOT-MRAM 3D array 500 according to one or more embodiments of the present invention. The SOT-MRAM 3D array 500 includes n levels, each formed of an SOT-MRAM 2D array. FIG. 5 further illustrates a read operation, $I_{Read}$, targeting a particular SOT-MRAM device on Level 3, where a read signal is input on a bottom SHE line of an SOT-MRAM 2D array on Level 4, and a result of the read signal is output on a top SHE line of Level 3.

Figure 6:
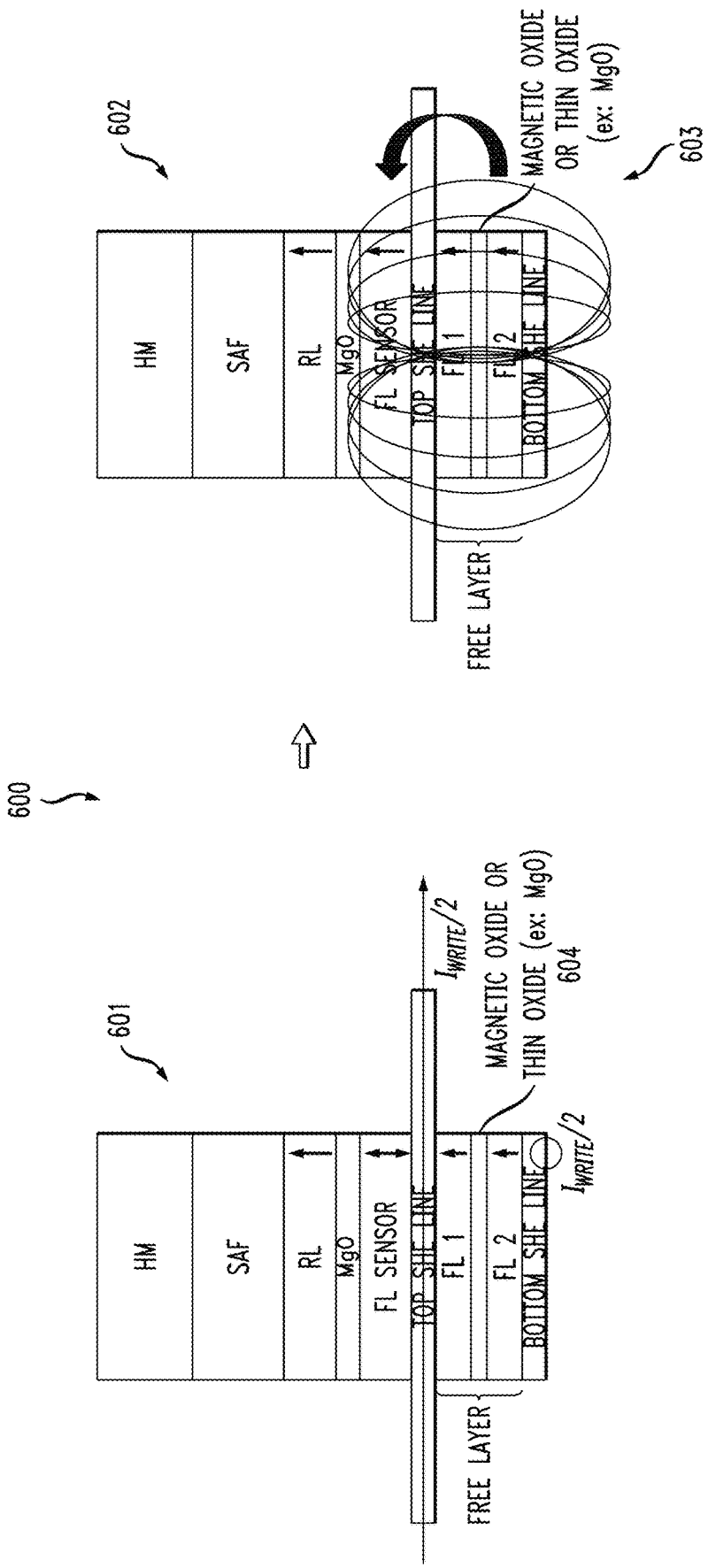
FIG. 6 illustrates a cross-point write operation according to one or more embodiments of the present invention.

FIG. 6 illustrates a cross-point write operation 600 according to one or more embodiments of the present invention.

According to some embodiments, a cross-point FL programming at 601 includes applying the $I_{Write}/2$ signal on each SHE write line of the device, such that the cross-point FL is programmed. According to some embodiments, the layer magnetizations of the upper cross-point FL and the lower cross-point FL of the device are coupled and aligned in the same direction. According to an example embodiment, the dielectric layer 604 in the FL (between FL1 and FL2) isolates the SHE lines in the cross-point region and provides a high magnetic coupling between FL1 and FL2 so that FL1 and FL2 can only switch as a single FL unit. According to some embodiments of the present invention, the FL cannot reverse its magnetization unless both the top SHE line and the bottom SHE line are simultaneously active to flip the FL1 and FL2 magnetization.

According to some embodiments, a current orientation in each SHE line is chosen to flip FL magnetization in the same direction during the write operation. The FL sensor layer of the top MTJ is randomly programmed.

According to some embodiments, a remote sensing layer programming at 602 includes removing the $I_{Write}/2$ signal on each SHE write line of the device, wherein the FL sensor layer magnetization aligns in the same direction as the magnetization of the cross-point FL (stray field), which achieves the remote sensing 603.

Figure 7:
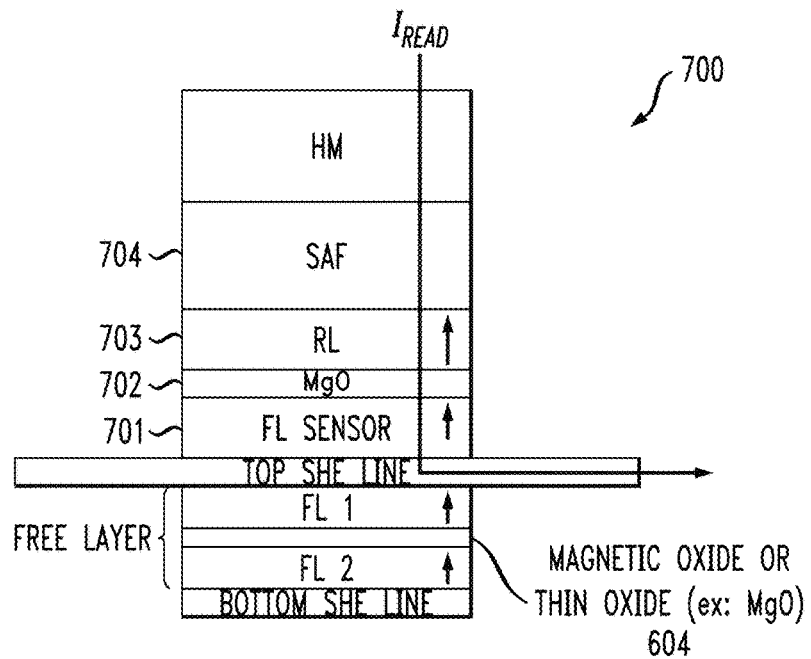
FIG. 7 illustrates a 2-terminal read operation according to one or more embodiments of the present invention.
Figure 8:
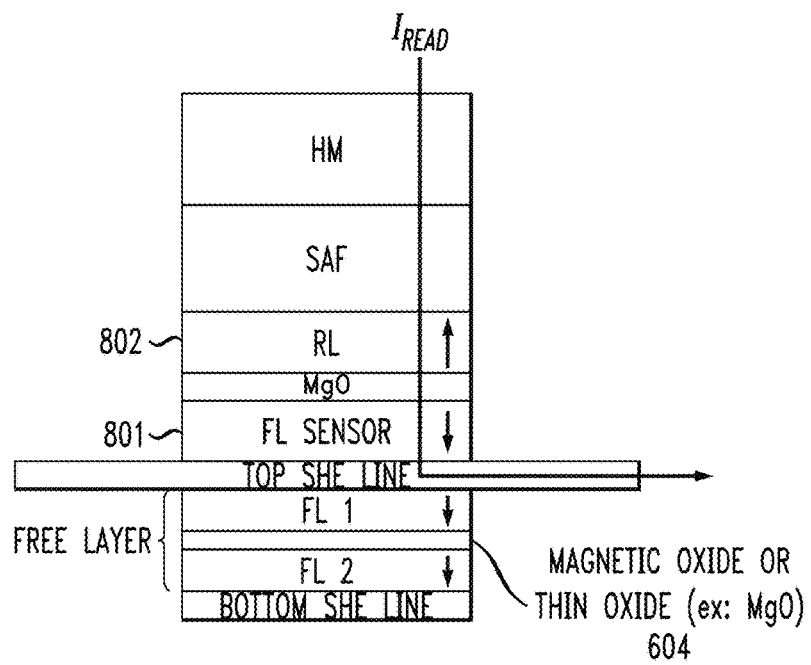
FIG. 8 illustrates a 2-terminal read operation according to one or more embodiments of the present invention.

FIG. 7 illustrates a 2-terminal read operation in a low-resistance state (i.e., with the magnetization of the FL sensor 701 aligned with the magnetization of the RL 703), according to one or more embodiments of the present invention. FIG. 8 illustrates a 2-terminal read operation in a high-resistance state (i.e., with the magnetization of the FL sensor 801 opposite the magnetization of the RL 802), according to one or more embodiments of the present invention.

As shown in FIG. 7, according to some embodiments, the 2-terminal read operation is performed by flowing a current, $I_{Read}$, through the top MTJ 700 formed by the FL sensor 701/TB 702/ and RL 703. It should be understood that the read mechanism is based on a difference of Tunnel-Magneto Resistance (TMR) of the MTJ based on the relative magnetic orientation of the RL and FL sensor, that is the resistance state of the device (see FIG. 7 and FIG. 8).

According to at least one embodiment, a Synthetic Anti-Ferromagnet (SAF) layer 704 can be deposited on the RL 703, below the HardMask (HM), to reduce or confine the stray magnetic fields generated by the RL layer. According to some embodiments, the SAF layer 704 helps reduce the stray magnetic field of the RL 703, further the SAF layer 704 is an active component of the RL magnetic design to help fix the magnetization orientation of the RL 703.

Figure 9:
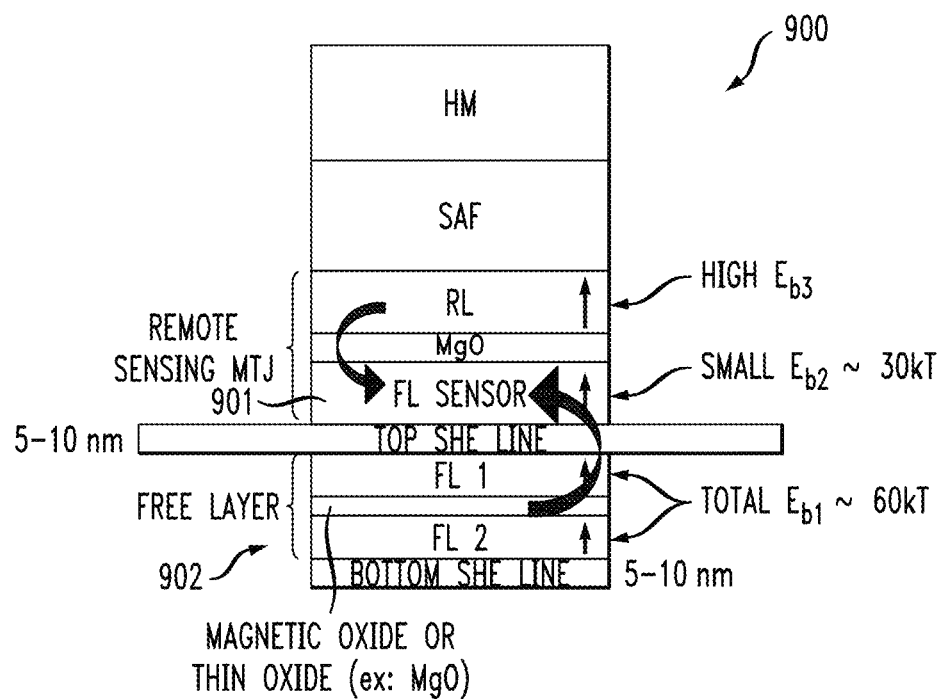
FIG. 9 is a diagram of a magnetic stack according to one or more embodiments of the present invention.

FIG. 9 is a diagram of magnetic stack engineering of a SOT-MRAM device 900 according to one or more embodiments of the present invention. As illustrated the FL sensor 901 of the remote sensing MTJ is subjected to stray fields, including a stray field from the RL and a stray field from the cross-point FL.

It should be understood that an Energy Barrier (Eb), typically given in $k_BT$, is attached to a given magnetic layer. A value of a given Eb represents an energy barrier to overcome to flip the magnetization from one stable magnetic orientation to another. Thus, the higher the Eb, the harder it is to flip the magnetization orientation from one stable magnetic state to another. It should be understood that kBT is the thermal energy, where $k_B$ is the Boltzmann constant, and T is temperature.

According to some embodiments, Eb1 corresponds to the FL, Eb2 corresponds to the FL sensor, and Eb3 corresponds to the RL, and Eb2~30 $k_B$T<Eb1~60 $k_B$T<Eb3. According to some embodiments, Eb2 is maintained at a relative moderate energy level to ensure that the stray magnetic field generated by the FL can overcome the energy barrier Eb2 of the FL sensor and successfully remote program the FL sensor. According to some embodiments, Eb1~60 $k_B$T, which is sufficiently high to reliably store data and ensure that magnetization orientation reversal from one stable magnetic state to another only occurs during cross-point SOT writing of the FL. According to at least one embodiment, Eb3 greater than any other energy barriers in the magnetic stack design since this is the RL and the magnetization should be anchored to ensure reliable read operation.

According to some embodiments, the stray fields align the magnetization of the FL sensor 901 to the cross-point FL 902. According to some embodiments, in the magnetic stack of the SOT-MRAM device 900, the $I_{Read}$ signal<$I_{Write}$/2 signal, which can reduce a risk of disturbing a FL1 magnetization orientation since $I_{Read}$ current generates a SOT insufficient to flip the FL1 magnetization.

It should be understood that the stray magnetic field is typically given in Oersted (Oe). A stray field is generated by a magnetization, such that every magnetic layer generates a stray field. According to some embodiments, for device operation, the stray field generated by the FL can program the FL sensor. While the stray field generated by the RL can impact the bit information in FL sensor, according to at least one embodiment, the SAF layer 704 reduces the stray magnetic field generated by the RL. According to some embodiments, the stray field from FL overpowers the stray field from RL to ensure that the FL sensor magnetization orientation is aligned with FL magnetization.

Figure 10:
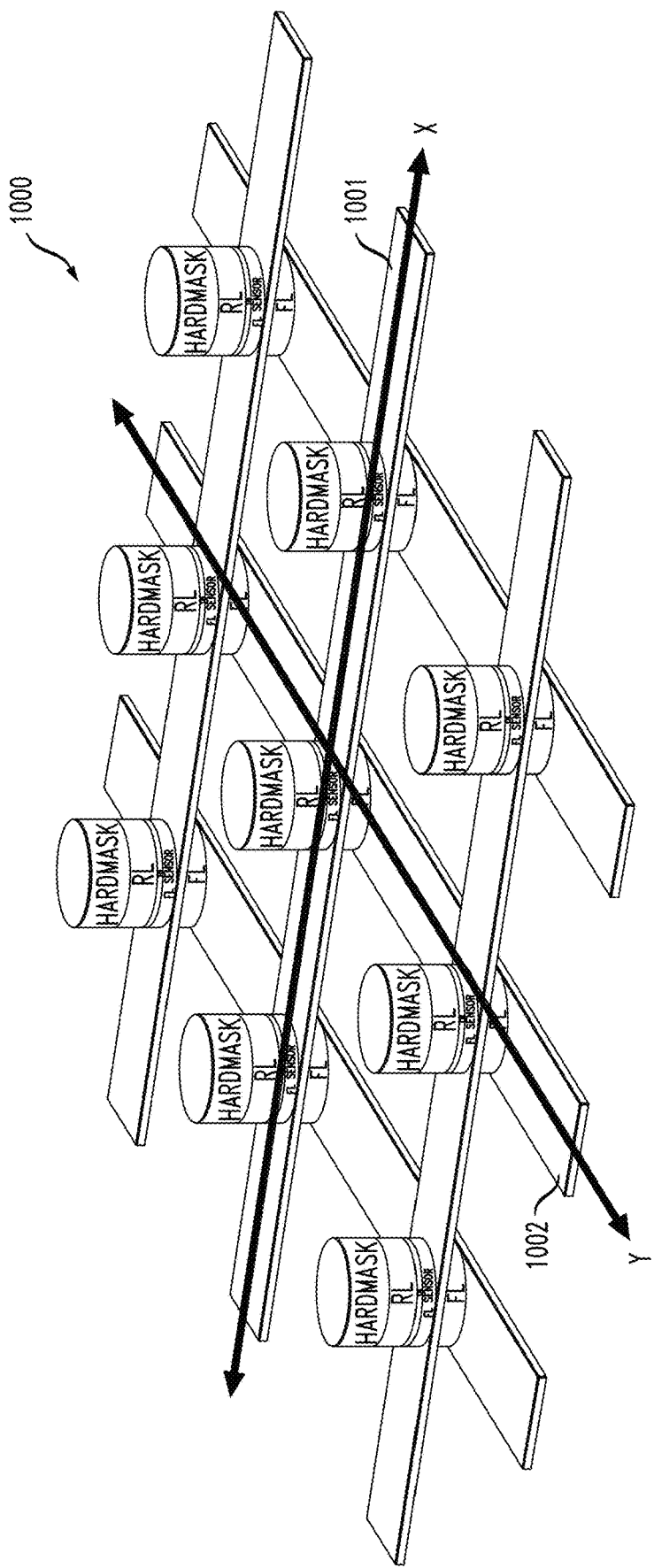
FIG. 10 is a diagram of a SOT-MRAM array according to one or more embodiments of the present invention.

FIG. 10 is a diagram of a SOT-MRAM 2D array 1000 according to one or more embodiments of the present invention. The SOT-MRAM 2D array 1000 includes a first set of bi-directional lines (i.e., top SHE lines), e.g., 1001, and a second set of bi-directional lines (i.e., bottom SHE lines), e.g., 1002. The cross-section lines X and Y correspond to the views of FIG. 11, FIG. 13, and FIG. 15.

Figure 11:
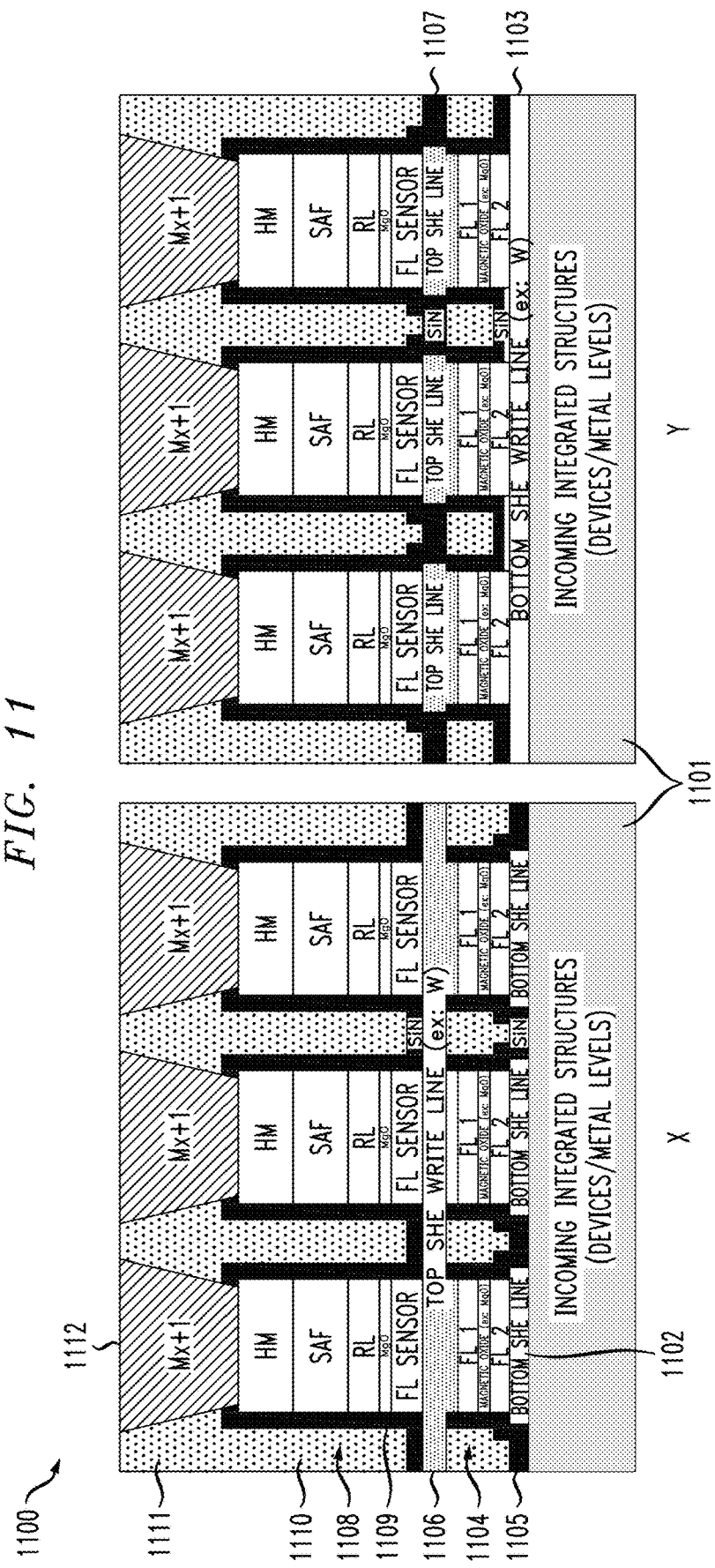
FIG. 11 is a diagram of a SOT-MRAM device according to one or more embodiments of the present invention.
Figure 12:
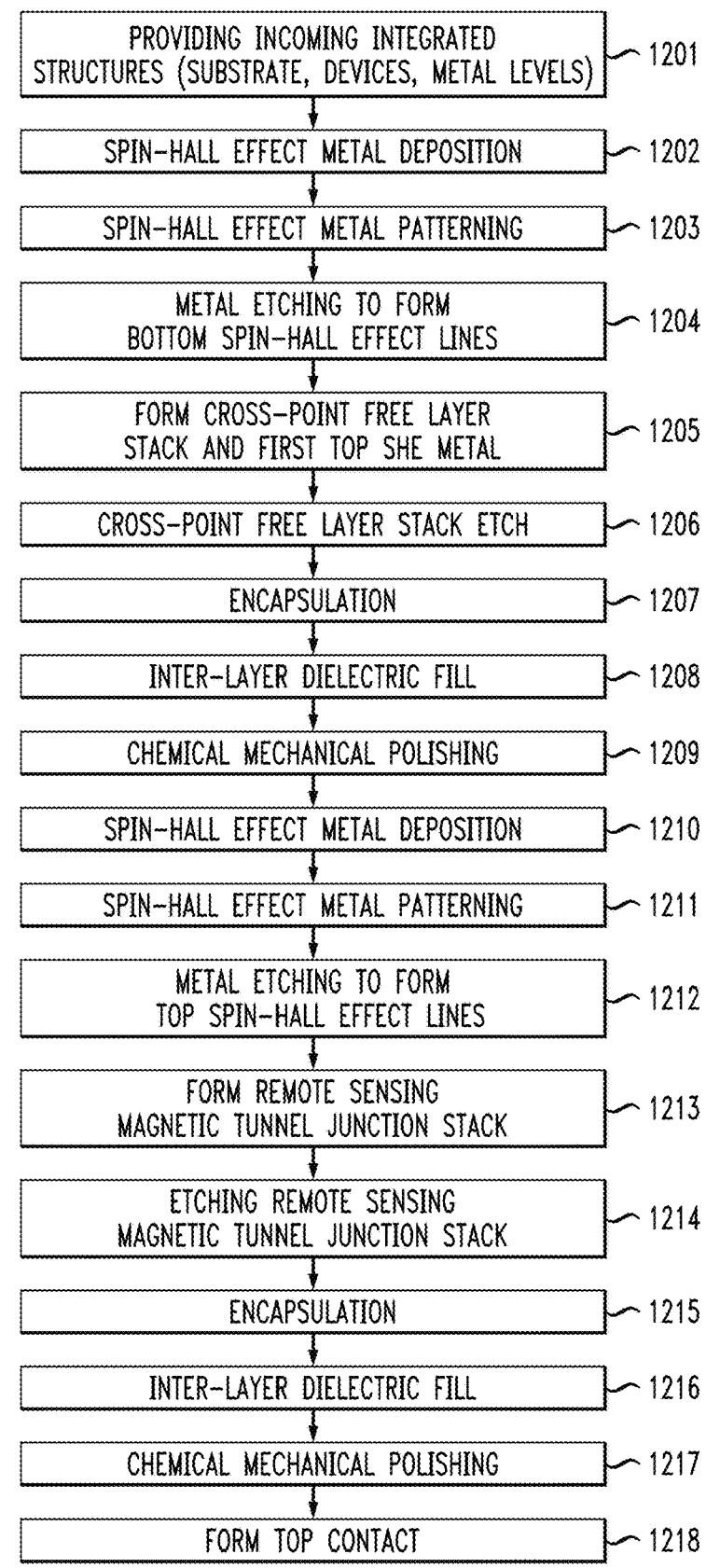
FIG. 12 is a flow diagram of a method of forming the SOT-MRAM of FIG. 11 according to one or more embodiments of the present invention.

Referring to FIG. 11 and FIG. 12, described are a first example SOT-MRAM device 1100 having remote sensing MTJ 1108 integrated above the cross-point FL 1104, and a method for manufacturing the same 1200 according to one or more embodiments of the present invention. Referring to FIG. 12, the method can include providing an incoming integrated structures (e.g., substrate, devices, metal levels) (1101) at step 1201 and forming a bottom SHE write line 1102, 1103, which includes depositing a SHE metal deposition at step 1202, patterning the SHE metal 1203, and etching the SHE metal at step 1204 to form the bottom SHE lines 1102, 1103. The method can further include forming the cross-point FL 1104, which includes depositing a cross-point FL stack and a first top SHE metal at step 1205, etching the cross-point FL stack at step 1206, wherein the top SHE metal layer acts as an HM, and an in-situ dielectric encapsulation at step 1207, e.g., in SiN 1105. The method can include an inter-layer dielectric fill at step 1208 and a chemical-mechanical polish (CMP) at step 1209 to expose the first top SHE metal. The method can include forming the top SHE write lines 1106, 1107, which includes depositing a second top SHE metal at step 1210, a SHE metal line patterning at step 1211, and a SHE metal etch at step 1212.

The method can further include forming a top remote sensing MTJ 1108, which includes depositing a remote sensing MTJ stack at step 1213, etching the remote sensing MTJ stack at step 1214, and an in-situ dielectric encapsulation at step 1215, e.g., in SiN 1109. As shown in FIG. 12, according to some embodiments, each top remote sensing MTJ 1108 includes the FL sensor 701, TB 702, and RL 703 (see FIG. 7). The method can include an inter-layer dielectric fill at step 1216 (see also 1110) and a CMP at step 1217 removing a top of the dielectric encapsulation 1109. According to some embodiments, the method includes forming a top contact at step 1218 (see also 1112), which may include forming vias in a second dielectric fill 1111 and the dielectric encapsulation 1109 exposing the HM, and deposing the top contact 1112. According to at least one embodiment, in a case where the CMP at step 1217 is performed to a top of the dielectric encapsulation 1109, the top contact can be formed by depositing a dielectric fill, forming vias in the dielectric fill and the dielectric 1109 exposing the HM, and deposing the top contact at step 1212.

Figure 13:
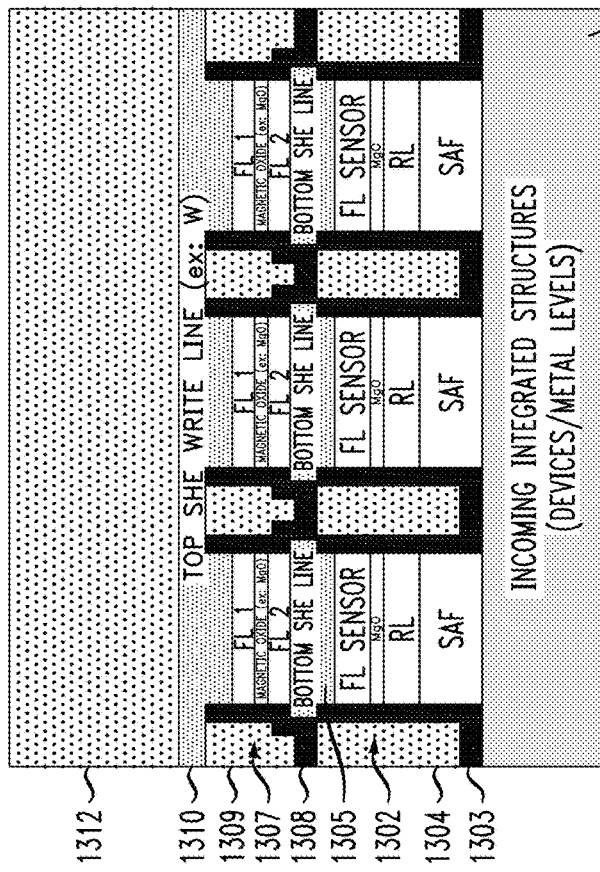
FIG. 13 is a diagram of a SOT-MRAM device according to one or more embodiments of the present invention.
Figure 14:
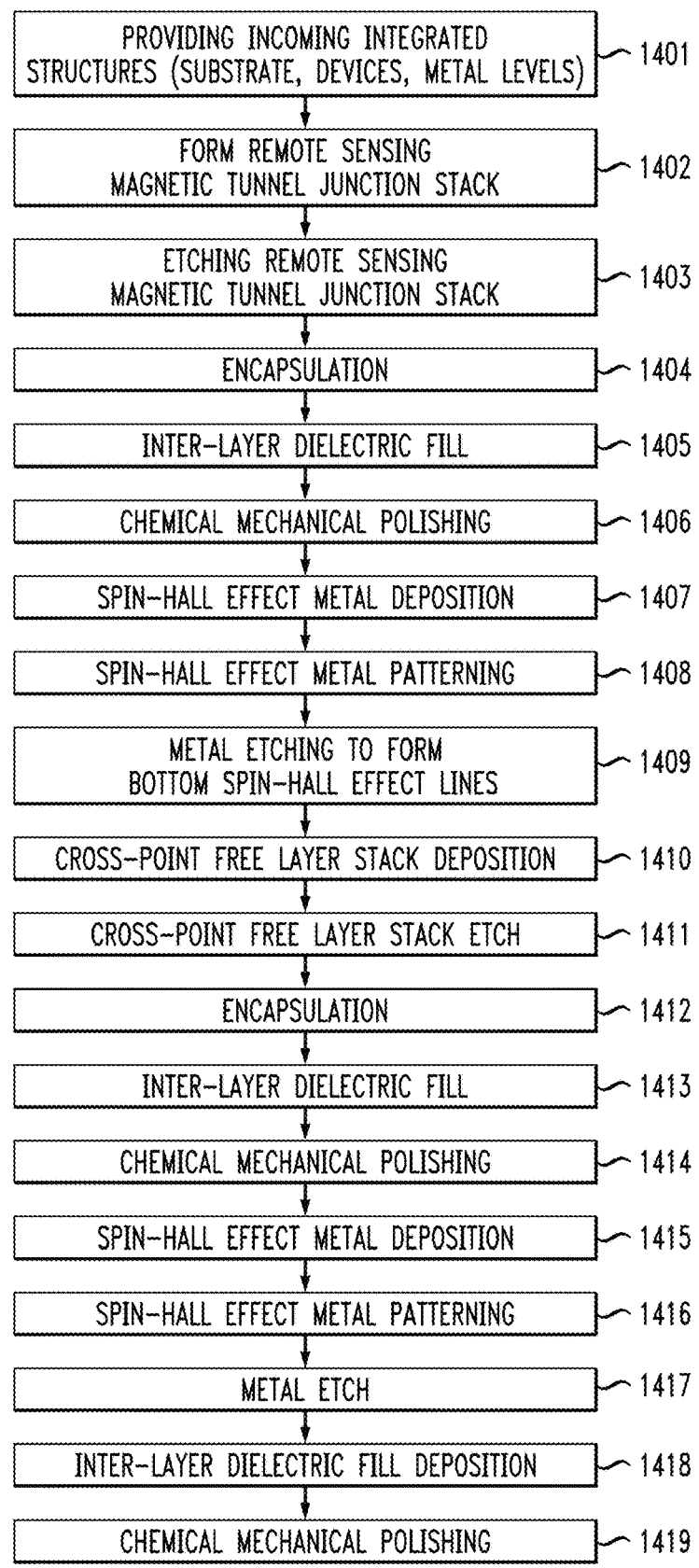
FIG. 14 is a flow diagram of a method of forming the SOT-MRAM of FIG. 12 according to one or more embodiments of the present invention.

Referring to FIG. 13 and FIG. 14, described are a second example SOT-MRAM device 1300 having a remote sensing MTJ integrated under a cross-point FL and a method for manufacturing the same 1400 according to one or more embodiments of the present invention.

Referring to FIG. 14, the method can include providing an incoming integrated structures (e.g., substrate, devices, metal levels) (at step 1401) at 1301 and forming bottom remote sensing MTJ device 1302, which includes depositing remote sensing MTJ stack and a first SHE metal at step 1402, etching the remote sensing MTJ stack at step 1403, using the first SHE metal as an HM, and an in-situ dielectric encapsulation 1404, e.g., using SiN 1303. According to some embodiments, the bottom remote sensing MTJ device 1302 includes an SAF layer, the RL, a TB, and an FL sensor. The method can include an inter-layer dielectric fill at step 1405 (see also 1304) and a CMP 1406 to a top of the first SHE metal. The method can further include forming the bottom SHE write line 1305, 1306, which includes a second SHE metal deposition at step 1407 on the first SHE metal, a SHE metal line patterning at step 1408, and a SHE metal etch at step 1409. The method can include forming a cross-point FL 1307, the method including depositing a cross-point FL stack at step 1410 including, in reverse order, a first FL (FL1) a high-coupling layer formed of a magnetic oxide or thin oxide (e.g., MgO), for example, about 2-15 nm, and a second FL (FL2). Step 1410 further includes depositing a first top SHE metal. The method can include etching the cross-point FL stack at step 1411, using the first top SHE metal as an HM, and an in-situ dielectric encapsulation 1412, e.g., of SiN 1308. According to some embodiments, the method includes depositing an inter-layer dielectric fill at step 1413 (see also 1309), and a CMP at step 1414 using the first top SHE metal as an etch stop. According to some embodiments, the method includes forming a top SHE write line 1310, 1311, which includes depositing a second top SHE metal 1415, SHE metal line patterning at step 1416, and a SHE metal etch at step 1417. According to some embodiments, the method further includes depositing an inter-layer dielectric fill at step 1418 (see also 1312) and a CMP at step 1419.

Figure 15:
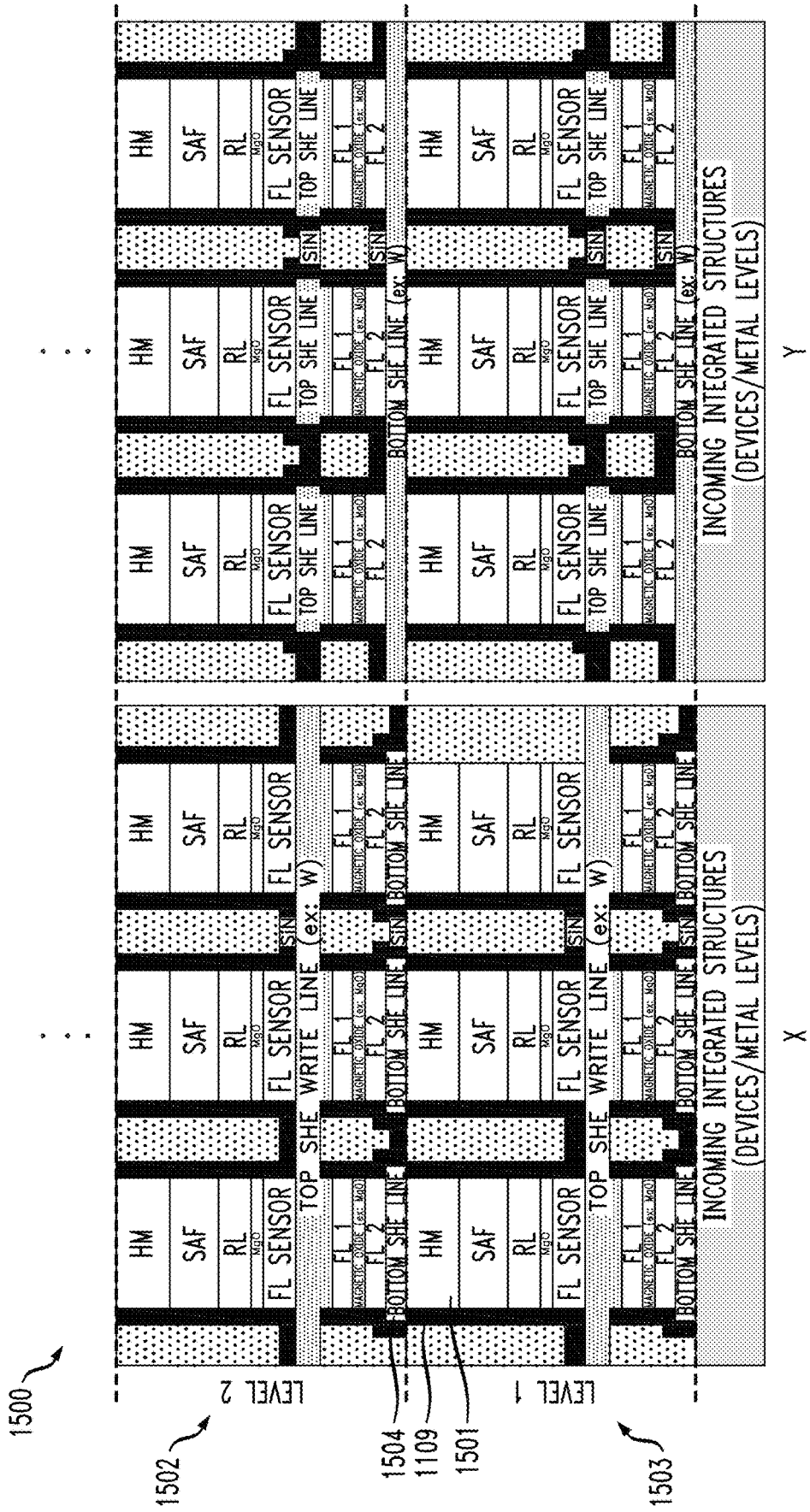
FIG. 15 is a diagram of a SOT-MRAM device according to one or more embodiments of the present invention.
Figure 16:
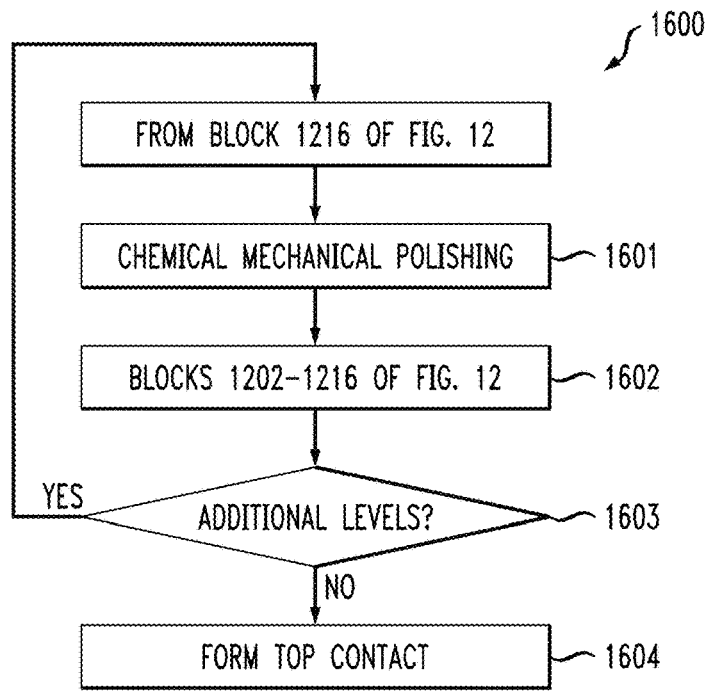
FIG. 16 is a flow diagram of a method of forming a 3D array based on the SOT-MRAM of FIG. 12 according to one or more embodiments of the present invention.

Referring to FIG. 15 and FIG. 16, described are a third example SOT-MRAM device 1500 and a method for manufacturing the same 1600 according to one or more embodiments of the present invention. More particularly, the third example SOT-MRAM device 1500 is a 3D array integration of the first example SOT-MRAM device 1100 of FIG. 11.

Referring to the method 1600 of FIG. 16, beginning from the inter-layer dielectric fill at step 1216 of FIG. 12, a CMP at step 1601 is performed stopping on the HM 1501 (i.e., removing a top portion of the dielectric encapsulation 1109). According to some embodiments, the method 1600 includes sequentially building a next level 1502 (level 2) on the preceding level 1503 (level 1) (see step 1602) according to steps 1202-1216 the method of FIG. 12, beginning at the step of depositing a metal deposition at step 1202 in the forming of the bottom SHE write line 1504. According to example embodiments, the method 1600 iterates for a number of levels at step 1603, and following a final level, includes forming a top contact at step 1604.

Figure 17:
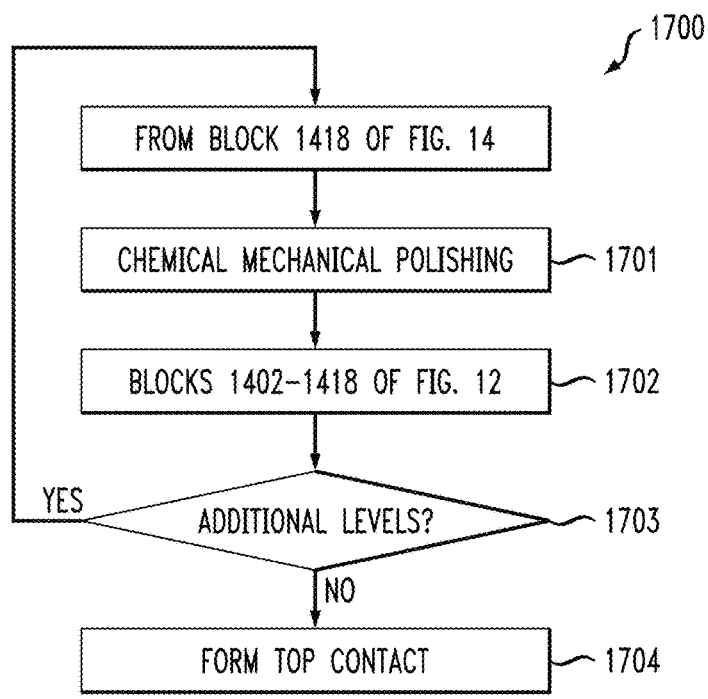
FIG. 17 is a flow diagram of a method of forming a 3D array based on the SOT-MRAM of FIG. 14 according to one or more embodiments of the present invention.

According to some embodiments, a 3D array can be constructed according to FIG. 17, where beginning from the inter-layer dielectric fill deposition at step 1418 of FIG. 14, the method 1700 further includes a CMP at step 1701 stopping on the top SHE write lines 1310, 1311 (see FIG. 13). According to some embodiments, the method includes sequentially building a next level (e.g., level n+1) on the preceding level 1300 (level 1) (see step 1702) according to steps 1402-1418 of the method of FIG. 14, beginning at the step of forming the bottom remote sensing MTJ stack at step 1402. According to example embodiments, the method 1700 iterates for a number of levels at step 1703, and following a final level, includes forming a top contact at step 1704.

Recapitulation:

According to embodiments of the present invention, a cross-point SOT-MRAM cell includes: a first SHE write line 1102; a second SHE write line 1106 non-colinear to the first SHE write line; a cross-point free layer 902 comprising a first free layer 408, a second free layer 410, and a dielectric layer 409 disposed between the first and the second free layers, the cross-point free layer configured to store a magnetic bit and located between and in contact with both the first SHE write line and the second SHE write line; and a remote sensing MTJ located in a vicinity of the cross-point free layer, wherein a free layer sensor 901 of the remote sensing MTJ is in contact with one of the first SHE write line and the second SHE write line.

According to an embodiment of the present invention, a method of forming cross-point SOT-MRAMs comprises: forming a bottom SHE write line at step 1204; forming a cross-point free layer at step 1206 on the bottom SHE write line, wherein forming the cross-point free layer comprises forming a first free layer, a second free layer, and a dielectric layer disposed between the first and the second free layers; forming a top SHE write line at step 1211 on the cross-point free layer, wherein the top SHE write line is non-colinear to the bottom SHE write line; and forming a top remote sensing MTJ at step 1214 on the top SHE write line.

According to an embodiment of the present invention, a method of forming a cross-point spin orbit-torque magnetic random-access memory cell comprises: forming a bottom remote sensing magnetic tunnel junction at step 1402 on a substrate; forming a bottom spin-hall effect write line at step 1409 on the bottom remote sensing magnetic tunnel-junction; forming a cross-point free layer at step 1411 on the bottom spin-hall effect write line, wherein forming the cross-point free layer comprises forming a first free layer, a second free layer, and a dielectric layer disposed between the first and the second free layers; forming a top spin-hall effect write line at step 1416 on the cross-point free layer, wherein the top spin-hall effect write line is non-colinear to the bottom spin-hall effect write line.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products ac-cording to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

According to some embodiments, the computer program product may include a computer readable storage medium (or media) having computer readable program instructions thereon for causing a processor to implement a method of manufacturing a cross-point spin orbit-torque magnetic random-access memory cell using wafer fabrication, assembly, and testing equipment. Descriptions of general purpose computers and/or computer program products, as provided herein, should not be taken to imply that such computers and/or computer program products must necessarily be used to carry out any or all steps of method embodiments described herein.

The terminology used herein is for the purpose of describing particular embodiments only and is not intended to be limiting of the invention. As used herein, the singular forms "a," "an" and "the" are intended to include the plural forms as well, unless the context clearly indicates other-wise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A cross-point spin orbit-torque magnetic random-access memory cell comprising:
   a first spin-hall effect write line;
   a second spin-hall effect write line non-colinear to the first spin-hall effect write line;
   a cross-point free layer comprising a first free layer, a second free layer, and a dielectric layer disposed between the first and the second free layers, the cross-point free layer configured to store a magnetic bit and located between and in contact with both the first spin-hall effect write line and the second spin-hall effect write line; and
   a remote sensing magnetic tunnel junction located in a vicinity of the cross-point free layer,
   wherein a free layer sensor of the remote sensing magnetic tunnel junction is in contact with one of the first spin-hall effect write line and the second spin-hall effect write line.

2. The cross-point spin orbit-torque magnetic random-access memory cell of claim 1, wherein the remote sensing magnetic tunnel junction is located below the first spin-hall effect write line.

3. The cross-point spin orbit-torque magnetic random-access memory cell of claim 1, wherein the remote sensing magnetic tunnel junction is located above the second spin-hall effect write line.

4. The cross-point spin orbit-torque magnetic random-access memory cell of claim 1, wherein the remote sensing magnetic tunnel junction comprises:
   the free layer sensor located in the vicinity of the cross-point free layer, wherein a magnetization of the free layer sensor is aligned in a same direction as a magnetization of the cross-point free layer;
   a reference layer; and
   a tunnel-barrier disposed between the free layer and the reference layer.

5. The cross-point spin orbit-torque magnetic random-access memory cell of claim 4, wherein a first energy barrier of the cross-point free layer is greater than a second energy barrier of the free layer sensor and less than a third energy barrier of the reference layer.

6. The cross-point spin orbit-torque magnetic random-access memory cell of claim 1, disposed in a two-dimensional memory cell array comprising a plurality of other cross-point spin orbit-torque magnetic random-access memory cells connected by a plurality of first spin-hall effect write lines, including the first spin-hall effect write line, and by a plurality of second spin-hall effect write lines, including the second spin-hall effect write line.

7. The cross-point spin orbit-torque magnetic random-access memory cell of claim 6, further comprising a three-dimensional memory cell array, including the two-dimensional memory cell array disposed in a stack of a plurality of two-dimensional memory cell arrays, and comprising a plurality of top contacts disposed above cross-point spin orbit-torque magnetic random-access memory cells of an upper two-dimensional memory cell array of the three-dimensional memory cell array.

8. The cross-point spin orbit-torque magnetic random-access memory cell of claim 7, wherein the second spin-hall effect write line is a bottom spin-hall effect write line disposed on a hardmask of a lower two-dimensional memory cell array of the three-dimensional memory cell array, wherein the hardmask is disposed on a respective remote sensing magnetic tunnel junction of the lower two-dimensional memory cell array.

9. The cross-point spin orbit-torque magnetic random-access memory cell of claim 7, further comprising a Synthetic Anti-Ferromagnet (SAF) layer disposed below the remote sensing magnetic tunnel-junction, wherein the SAF layer is disposed on a top spin-hall effect write line of a lower two-dimensional memory cell array of the three-dimensional memory cell array.

10. The cross-point spin orbit-torque magnetic random-access memory cell of claim 1, wherein the dielectric layer isolates the first spin-hall effect write line from the second spin-hall effect write line in a cross-point region, and provides a high coupling layer between the first free layer and the second free layer so that the first free layer and the second free layer switch as a single free layer unit.

11. A method of forming a cross-point spin orbit-torque magnetic random-access memory cell comprising:
 forming a bottom spin-hall effect write line;
 forming a cross-point free layer on the bottom spin-hall effect write line, wherein forming the cross-point free layer comprises forming a first free layer, a second free layer, and a dielectric layer disposed between the first and the second free layers;
 forming a top spin-hall effect write line on the cross-point free layer, wherein the top spin-hall effect write line is non-colinear to the bottom spin-hall effect write line; and
 forming a top remote sensing magnetic tunnel junction on the top spin-hall effect write line.

12. The method of claim 11, further comprising forming a top contact on the top remote sensing magnetic tunnel-junction.

13. The method of claim 12, further comprising:
 a Synthetic Anti-Ferromagnet (SAF) layer disposed on the top remote sensing magnetic tunnel-junction; and
 a hardmask layer disposed on the SAF layer, wherein the top contact is disposed on the hardmask.

14. The method of claim 11, further comprising a dielectric encapsulation layer separating the bottom spin-hall effect write line from an adjacent bottom spin-hall effect write line of an adjacent cross-point spin orbit-torque magnetic random-access memory cell.

15. The method of claim 11, wherein the cross-point spin orbit-torque magnetic random-access memory cell is disposed in an upper two-dimensional memory cell array comprising a plurality of other cross-point spin orbit-torque magnetic random-access memory cells, and the bottom spin-hall effect write line is formed over a lower top remote sensing magnetic tunnel junction of a lower cross-point spin orbit-torque magnetic random-access memory cell disposed in a lower two-dimensional memory cell array below the upper two-dimensional memory cell array.

16. A method of forming a cross-point spin orbit-torque magnetic random-access memory cell comprising:
 forming a bottom remote sensing magnetic tunnel junction on a substrate;
 forming a bottom spin-hall effect write line on the bottom remote sensing magnetic tunnel-junction;
 forming a cross-point free layer on the bottom spin-hall effect write line, wherein forming the cross-point free layer comprises forming a first free layer, a second free layer, and a dielectric layer disposed between the first and the second free layers; and
 forming a top spin-hall effect write line on the cross-point free layer, wherein the top spin-hall effect write line is non-colinear to the bottom spin-hall effect write line.

17. The method of claim 16, further comprising depositing an inter-layer dielectric fill on the top spin-hall effect write line.

18. The method of claim 16, wherein forming the bottom remote sensing magnetic tunnel junction comprises:
 forming a reference layer on the substrate;
 forming a tunnel-barrier on the reference layer; and
 forming a free layer sensor on the tunnel-barrier and located in a vicinity of the cross-point free layer, wherein a magnetization of the free layer sensor is aligned in a same direction as a magnetization of the cross-point free layer.

19. The method of claim 18, further comprising:
 forming a Synthetic Anti-Ferromagnet (SAF) layer disposed on the substrate between the bottom remote sensing magnetic tunnel junction and the substrate.

20. The method of claim 16, further comprising a dielectric encapsulation layer separating the bottom spin-hall effect write line from an adjacent bottom spin-hall effect write line of an adjacent cross-point spin orbit-torque magnetic random-access memory cell.

* * * * *